US005597458A

United States Patent [19]
Sanchez, Jr. et al.

[11] Patent Number: 5,597,458
[45] Date of Patent: Jan. 28, 1997

[54] METHOD FOR PRODUCING ALLOY FILMS USING COLD SPUTTER DEPOSITION PROCESS

[75] Inventors: John E. Sanchez, Jr., Palo Alto; Darin A. Chan, Campbell; Paul R. Besser, Cupertino, all of Calif.

[73] Assignee: Advanced Micro Devices, Sunnyvale, Calif.

[21] Appl. No.: 500,296

[22] Filed: Jul. 10, 1995

[51] Int. Cl.$^6$ .................................................. C23C 14/34
[52] U.S. Cl. ................... 204/192.3; 204/192.12; 204/192.15; 204/192.17; 437/198
[58] Field of Search ................ 204/192.12, 192.15, 204/192.17, 192.3; 437/198

[56] References Cited

FOREIGN PATENT DOCUMENTS 2-91941    3/1990    Japan ............................... 204/192.17

OTHER PUBLICATIONS

D. R. Denison et al, *J. Vac. Sci. Technol.*, vol. 17, No. 6, Nov./Dec. 1980, pp. 1326–1330.

"Grain Growth in Al–2% Cu Thin Films", J. E. Sanchez, Jr., et al., (1992), *Materials Science Forum*, vol. 94–96, pp. (1992) pp. 563–570.

"The Evolution of Microstructure in Al–2 Pct Cu Thin Films: Precipitation, Dissolution, and Reprecipitation", D. R. Frear et al., (Sep. 1990), *Metallurgical Transactions*, vol. 21A, pp. 2449–2458.

*Primary Examiner*—Aaron Weisstuch
*Attorney, Agent, or Firm*—Skjerven, Morrill, MacPherson, Franklin & Friel; Patrick T. Bever

[57] ABSTRACT

A method for forming an alloy film by cooling a substrate during a sputter deposition process. In one embodiment, aluminum-copper (Al-Cu) alloy film is deposited on a substrate while the substrate is maintained at a temperature lower than 100° C. during a sputter deposition process, thereby reducing the precipitation of $CuAl_2$. The substrate is cooled by pumping a coolant gas through a cooled platen and against the substrate during processing. Subsequent film formation prior to etching is also performed below 100° C. to prevent precipitation of $CuAl_2$ until the Al-Cu alloy film is etched. Large crystal grains are formed by annealing the substrate after etching.

12 Claims, 1 Drawing Sheet

5,597,458

METHOD FOR PRODUCING ALLOY FILMS USING COLD SPUTTER DEPOSITION PROCESS

BACKGROUND

1. Field of the Invention

The present invention pertains to the deposition of alloy films, and more particularly to the formation of alloy films onto cooled base materials during sputter deposition processes.

2. Description of the Prior Art

Metal alloy films are used in many applications including integrated circuit fabrication. These alloy films are often formed by sputter deposition processes onto base materials, such as semiconductor substrates, glass or other materials.

In advanced integrated circuit fabrication, aluminum-based alloy films are commonly used to form metallization interconnects. These aluminum-based alloy films are deposited onto a wafer (substrate) using a sputter deposition process and then etched using known techniques to define the metallization interconnects. During the sputter deposition process, an aluminum-based target is bombarded with ions to form a vapor (of roughly the same composition as the target) which is then transported to the wafer upon which the vapor is deposited to form the thin film. The target composition primarily determines the deposited thin film composition. Using conventional sputter deposition processes, the vapor typically reaches a temperature of 250° to 430° C., and the wafer is maintained at approximately this temperature by a heated gas which is directed onto the wafer.

Aluminum-copper (Al—Cu) alloys are generally favored over other aluminum-based alloys for the formation of metallization interconnects in advanced integrated circuits. Copper is added to the aluminum base material to increase the reliability of the interconnects against electromigration-induced damage. It is generally understood that the addition of copper to pure aluminum or to other aluminum-based alloys (such as aluminum-silicon, aluminum-titanium, and aluminum-magnesium) results in significant improvements in the resistance to electromigration-induced damage, and therefore increases the reliability of the aluminum-based interconnect structure.

A detailed understanding of the basic mechanism for the improvement of electromigration reliability, and the role copper additions play in this improvement, is still unclear and is a matter of scientific inquiry. Therefore, the reliability improvement provided by copper additions cannot be simply summarized, and cannot be generally described by a "universal improvement factor". However, it is roughly generally true and accepted that, for a given overall interconnect structure and device technology, increased copper concentrations lead to increased levels of reliability. Therefore, the increasing reliability demands of advanced integrated circuit technologies require the development of interconnect structures with increased copper concentrations.

The composition of Al-Cu alloys presently used for metallization interconnects typically ranges from 99.5% aluminum-0.5% copper to 99.0% aluminum-1.0% copper, where the concentrations are listed as weight percentages. It is even more desirable to increase the concentration of copper above 1%.

However, problems arise when Al-Cu alloys having 1% copper or more are used in conventional sputter deposition processes. In particular, the deposited aluminum-copper alloy film is comprised of several phases. One phase, the equilibrium intermetallic compound phase "$CuAl_2$", precipitates during deposition and co-exists with the aluminum rich "matrix" phase which forms the basis of the film. These $CuAl_2$ phases are more difficult to remove during reactive-ion-etching ("RIE") processes, which are used to define and pattern interconnect structures to form the metallization interconnects. After the RIE process, the $CuAl_2$ phase residues often remain on the surface of the silicon wafer in regions which should normally be cleared of any traces of the aluminum-copper film. These remaining $CuAl_2$ phase residues present obstacles to defect-free integrated circuit manufacturing and are identified as the source of decreased manufacturing yield during fabrication.

The physical basis for the difficulty in RIE removal of the aluminum-copper films and the $CuAl_2$ phases is not completely understood. However it is generally believed that, in contrast to aluminum, copper does not form copper-halide compounds of sufficient vapor pressure or volatility during the typical conditions of RIE. As a result the removal rate ("etch rate") of copper rich regions of aluminum-copper films is quite low with respect to the nominally pure aluminum regions. Therefore, local regions of high copper concentration (such as the $CuAl_2$ phases intermixed throughout the aluminum-copper film) are not removed from the surface of the wafer during RIE, resulting in the observed copper-rich residues.

Multilevel integrated circuit device technologies typically require increased processing temperatures during aluminum-copper alloy sputter deposition processes. Generally, increased aluminum-copper deposition temperatures are required due to the increased severity of the topology of the various layers upon which the aluminum-copper layers are deposited. The increased temperatures during sputter depositions provide increased uniformity of the deposited layer thickness ("step coverage") over the inclined surface topologies, resulting in increased interconnect thickness uniformity over these topographies. However, these increased sputter deposition temperatures of aluminum-copper alloys typically result in increased $CuAl_2$ precipitation during deposition, resulting in greater manufacturing difficulty and decreased manufacturing yield. In addition, increased copper additions, as desired for the greater device reliability for future device technologies, will lead to further increased $CuAl_2$ precipitation during elevated temperature depositions, again complicating manufacturing processes and decreasing yields.

Recent advances in "planarization" manufacturing methods and processes have resulted in nearly flat surface topographies. However, the use of conventional elevated-temperature sputter deposition processes has continued for the formation of Al-Cu alloy films.

SUMMARY

In accordance with the present invention, a method is provided for forming alloy films on a base material in which the base material is cooled to a temperature at which the precipitation of unwanted phases is minimized during a sputter deposition process. By cooling the base material, the sputtered alloy film is "frozen" as it forms on the base material, thereby reducing the precipitation of unwanted phases from the alloy material.

In accordance with a first aspect of the present invention, the "cold" sputter deposition process is used to form an aluminum-copper (Al-Cu) alloy film which increases the copper content of Al-Cu alloy films while decreasing the size and number of CuAl$_2$ precipitates, thereby improving both device reliability and production yield.

In accordance with a second aspect of the present invention, the "cold" sputter deposition process is used during integrated circuit fabrication in which Al-Cu alloy films are formed on a cooled wafer (substrate). In one embodiment, the wafer is mounted on wafer holder ("platen" or "chuck") through which a room temperature (approximately 25° C.) coolant gas is directed against the wafer. The coolant gas maintains the wafer near room temperature. By maintaining the wafer at approximately room temperature, the Al-Cu alloy film is "frozen" during deposition, thereby reducing the precipitation of CuAl$_2$. Because the number of CuAl$_2$ precipitates is reduced, subsequent reactive-ion-etching (RIE) of the Al-Cu alloy film is substantially more effective, thereby improving production yields, when compared to films produced by conventional elevated temperature sputter deposition processes. To prevent electromigration-induced failure, large crystalline grains can be formed in the Al-Cu alloy films by annealing the films after RIE.

BRIEF DESCRIPTION OF THE DRAWINGS

These and other features, aspects and advantages of the present invention will become better understood with regard to the following description, appended claims, and accompanying drawings, where:

DETAILED DESCRIPTION

Figure 1:
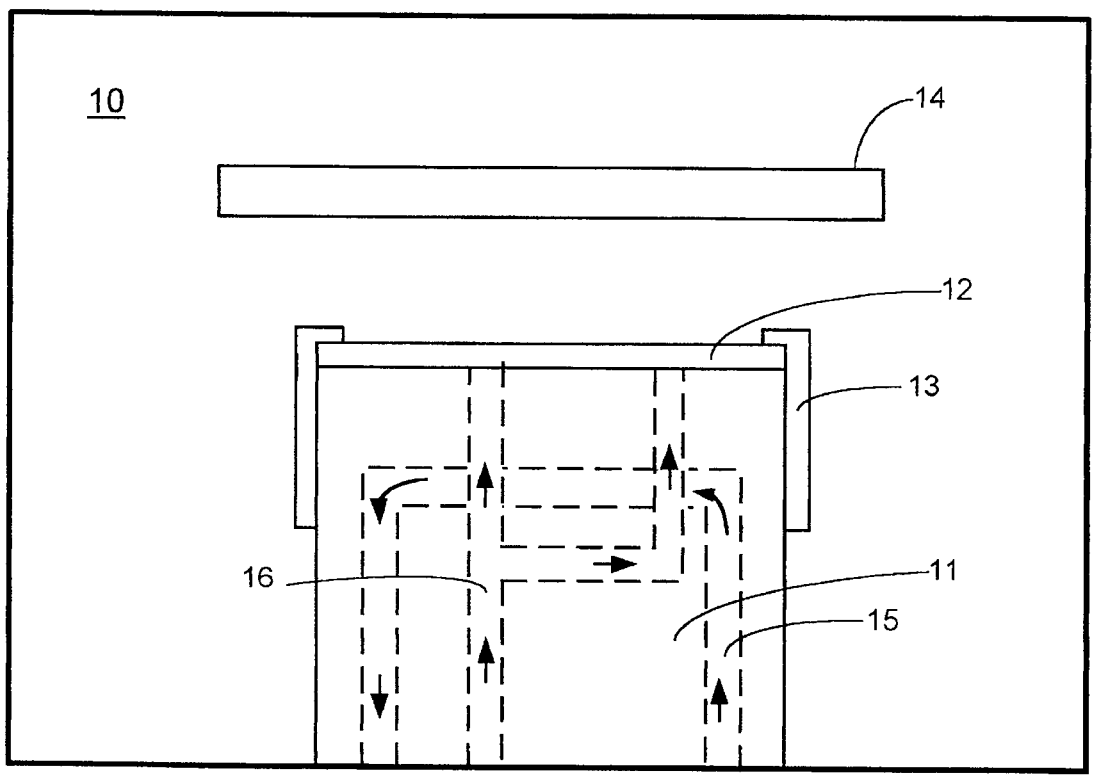
FIG. 1 is a simplified diagram showing a process chamber used during a cold sputter deposition process in accordance with the present invention.

In accordance with the present invention, alloy films are formed using a "cold" sputter deposition process in which a base material (such as a semiconductor wafer, glass or other substrate) is maintained at a low temperature to prevent the precipitation of unwanted phases. Unwanted phases are structures precipitated from the alloy film during or after deposition which undesirably change the alloy film composition, or which have a deleterious effect on subsequent processing of the alloy film.

The present invention is described with reference to the sputtering of aluminum alloy films, and in particular to the sputtering of aluminum-copper (Al-Cu) alloy films during the production of integrated circuit devices. In this embodiment, the unwanted phase precipitating from the Al-Cu alloy films is CuAl$_2$. However, those of ordinary skill in the art will recognize that the "cold" sputter deposition process described below with respect to Al-Cu alloy films is also applicable to the formation of other alloy films and to the production of other articles of manufacture. In addition, the method described below is recognized as having potential applications in other deposition processes, such as evaporation or plasma vapor deposition. However, because of the high film deposition rates and concomitant substrate heating, the method is particularly applicable to sputter deposition processes.

From metallurgical literature, it is established that the distribution of copper in aluminum-copper alloys is primarily determined by the thermal history and overall composition of the alloy. From this understanding, the present invention provides a method for controlling the size, distribution and morphology of the CuAl$_2$ phases during the sputter deposition of aluminum-copper (Al-Cu) alloy films.

In accordance with one aspect of the present invention, the temperature of the alloy film is maintained at low enough temperatures during deposition to prevent the solid state diffusion of the copper, thereby reducing the formation (by diffusion) of the CuAl$_2$ phases. This "cold" deposition temperature is accomplished by maintaining the wafer holder ("platen") at room temperature (approximately 25° C.) using internal circulation of cooling fluid (such as water) within the platen and by cooling the wafer using a coolant gas passing through the cooled platen. By maintaining good thermal/physical contact between the wafer and cooled platen, the wafer temperature is maintained at nearly room temperature (or the temperature of the platen/cooling water) during deposition. Some heating from the sputtering plasma ambient to the wafer is expected, but the cooled platen efficiently maintains the wafer at nearly the platen temperature. Differences between the actual wafer surface temperature during deposition and the cooled platen temperature are estimated to be approximately 50° C. maximum, so that the wafer is typically maintained in the range of 50° to 75° C.

In accordance with a second aspect of the present invention, the temperature of a subsequent film deposition (such as certain TiN anti-reflection coatings after the aluminum-copper film deposition), which is deposited on the Al-Cu alloy film prior to the RIE process, is maintained at a temperature below 100° C. using the same cooled platen method described above. It is important to note that, subsequent to all film depositions for the interconnect stack, any wafer heating at approximately 100° C. and above for any length of time will allow the copper diffusion and formation of CuAl$_2$ phases, which would then be difficult to etch using an RIE process. Therefore, for practical implementation, the temperature exposure of wafers after cold sputter depositions and prior to RIE processing must be maintained to below 100° C. Following RIE processing, the wafers may be subjected to annealing to produce a desired crystal grain size, thereby reducing electromigration-induced damage.

The present invention will now be described in additional detail with reference to FIG. 1.

FIG. 1 shows a chamber 10 used during the "cold" sputter deposition process. Chamber 10 includes a platen 11 having an upper surface upon which is mounted a wafer 12. Above platen 11 is a target 14. Platen 11 is formed with first coolant conduits 15 through which a coolant fluid, such as water, is directed to maintain platen 11 at approximately room temperature. Platen 11 is also formed with second coolant conduits 16 through which a coolant gas, such as argon, is directed against the lower surface of wafer 12 such that wafer 12 is maintained at a temperature below 100° C., and more preferably in the range of 50° to 75° C.

During fabrication of an integrated circuit, several insulator layers and metallization interconnects are laminated onto wafer 12, the first of such insulator layers typically being formed directly onto an upper surface of wafer 12 using known techniques. Metallization interconnects are often made up of aluminum-copper (Al-Cu) alloy films which are formed by sputter deposition processes. During a sputter deposition process, target 14 is bombarded by ions such that sputtered material (in this case aluminum and copper atoms) is transported as a vapor to wafer 12. Consequently, an Al-Cu film grows on wafer 12 through deposition.

In accordance with a first aspect of the present invention, coolant fluid is pumped through conduits 15 during the deposition of Al-Cu alloy films using sputter deposition processes. The flow of coolant fluid is controlled such that platen 11 is maintained near room temperature. Further, a coolant gas, such as argon, is pumped through conduits 16 against the wafer 12. The coolant gas is cooled to the temperature of the platen 11, thereby maintaining the upper surface of wafer 12 at approximately 50° C.

The present "cold" sputter deposition process is particularly useful when the surface upon which the Al-Cu alloy film is deposited is first subjected to a planarization fabrication process. Because planarization presents a substantially flat surface during the deposition of Al-Cu films, the requirements for elevated temperatures previously necessary for step coverage are eliminated since there are no "steps" to challenge the uniformity of deposition processes. This allows for the deposition temperature to be an extra "degree of freedom" such that the temperature can be used as a deposition variable to control and minimize the $CuAl_2$ phase precipitation in aluminum-copper films.

One benefit of the reduced $CuAl_2$ phase formation during deposition is improved RIE processes and etchability of the aluminum-copper films. Typically, the last step in a RIE sequence is an "over-etch" step which is designed to remove the remaining $CuAl_2$ residues left after the primary aluminum has been removed. However, the $SiO_2$-based substrate is exposed and eroded by the RIE environment during this over-etch step. Reducing the amount of over-etch required, by reducing the amount of $CuAl_2$ formed during the cold sputter deposition process, will reduce the amount of $SiO_2$ loss and erosion which will benefit subsequent gap-fill and planarization efforts. The improved "etchability" of cold deposited aluminum-copper films will also allow more flexibility in the process conditions during the RIE process, allowing for greater latitude during the etching process for the control of other interconnect requirements, such as better or more uniform edge/profile control.

An additional benefit of the "cold" sputter deposition process according to the present invention is reduced copper-rich residue and associated defects after the etching processes. Even after prolonged "over-etch" steps, some remaining $CuAl_2$ residues are observed which are described as increased levels of defects and contamination. Reducing the amount of $CuAl_2$ residue left after RIE processes, by implementing the "cold" Al-Cu sputter deposition process, will reduce the detected levels of observed defects and contamination.

A further benefit of the "cold" sputter deposition process according to the present invention is the incorporation of increased copper levels in aluminum-copper alloys. Because the "cold" Al-Cu sputter deposition process reduces $CuAl_2$ formation, new aluminum-copper alloys with increased copper contents may be successfully RIE etched. The major and significant benefit of increased copper content in aluminum-based interconnects is increased device reliability against electromigration-induced failure processes.

Example

In an example of the "cold" sputter deposition process according to the present invention, a 6" wafer was placed on a platen in an Applied Materials Endura 5500 UHV DC Megatron Sputtering System and clamped using a stainless steel clamp ring. An aluminum target with 1% copper in solution was positioned over the wafer within the chamber. The chamber was then sealed and evacuated to a base pressure of $3 \times 10^{-8}$ torr, then back-filled with argon to a process pressure of 1 to 6 millitorr. Room temperature water was passed through the heater block supporting the platen, with the heater turned off. Argon gas was directed through the platen against the underside of the wafer, creating a back pressure which pressed the wafer against the clamp ring. Sputtering was then performed at nine kilowatts. During the sputter deposition process, the wafer was heated to approximately 50° C. (approximately 25° C. above the platen temperature), but was prevented from significantly exceeding 50° C. by the argon gas. An Al-Cu alloy film was formed on the wafer at approximately one micron per minute.

Table 1 (below) compares manufacturing yield data for wafers produced using the cold sputter deposition process (at approximately 50°–75° C.) according to the present invention with wafers produced using a convention sputter deposition process at 250° C.

TABLE 1

| over-etch=> | 0% | 25% | 50% | 75% | 100% | 125% | 150% | 175% |
|---|---|---|---|---|---|---|---|---|
| 250° C. deposition | | | | | | | | |
| die yield (%) | 0 | 0 | 0 | 5 | 17 | 69 | 68 | 88 |
| quad yield (%) | 0 | 0 | 0 | 11 | 30 | 77 | 79 | 96 |
| block yield (%) | 0 | 0 | 0 | 22 | 37 | 82 | 84 | 99 |
| defect density | | | | 16.3 | 9.5 | 2.1 | 2.4 | 1.4 |
| 50° C. deposition | | | | | | | | |
| die yield (%) | 0 | 0 | 0 | 6 | 52 | 93 | 92 | 92 |
| quad yield (%) | 0 | 0 | 0 | 8 | 65 | 97 | 98 | 97 |
| block yield (%) | 0 | 0 | 0 | 9 | 76 | 100 | 100 | 99 |
| defect density | | | | 7.9 | 4.5 | 1.1 | 0.9 | 0.9 |

The die, quad, and block yield information in Table 1 describes different interpenetrating serpentine patterns of two separate metallization structures. Dies, quads, and blocks are different area sized interpenetrating defect monitors, with eight blocks to each quad, and four quads to each die (each block is 0.002681 sq. in.). The conducting defects, particles or residues such as the $CuAl_2$ residues that are left after RIE patterning, cause short circuits between these adjacent patterns and such short circuits constitute a failed circuit. Typically, the yield for each die, quad, or block, is defined as the percentage of good or non-shorting circuits for each of these types. The defect densities are typically calculated by comparing the yield data from these different area patterns. The data in the table shows that for a given RIE patterning process, the cold aluminum deposition provides better yield and lower defect densities over a wide range of reduced over-etch times. Reduced over-etch is desirable, as discussed above.

As indicated in Table 1, the "cold" sputter deposition process produced die, quad, and block samples having significantly better yields, as compared to samples produced by the conventional elevated-temperature sputter deposition process.

Although the invention is described herein with reference to the embodiment shown in FIG. 1 and in the above example, one skilled in the art will readily appreciate that the method set forth herein may be used in other applications without departing from the spirit and scope of the present invention. In alternate embodiments of the invention, the alloy films may be aluminum-silicon or other aluminum alloys. Further, the invention may be used to produce, for example, flat panel displays. Accordingly, the invention should only be limited by the claims included below.

We claim:

1. A method for forming an alloy film on a base material, the method comprising the steps of:

mounting the base material on a platen;

pumping a coolant fluid through the platen such that the base material is cooled to a temperature lower than a precipitation temperature of an unwanted phase; and depositing the alloy film over the cooled base material using a sputter deposition process while maintaining the temperature of the base material below the precipitation temperature of the unwanted phase.

2. The method according to claim 1, wherein the step of cooling further comprises maintaining the base material at a temperature lower than 100° C. during the step of depositing the alloy film.

3. The method according to claim 1, wherein the step of cooling wherein the step of pumping a coolant fluid through the platen comprises pumping room temperature water at a rate such that the base material is maintained within the range of 50° to 75° C. during the step of depositing the alloy film.

4. A method for forming an aluminum alloy film on a substrate, the method comprising the steps of:

mounting the substrate on a platen;

pumping a coolant fluid through the platen such that the platen is maintained at a first temperature, thereby cooling the substrate to a temperature lower than 100° C.; and depositing the aluminum alloy film on the cooled substrate using a sputter deposition process while maintaining the substrate at a temperature lower than 100° C.

5. The method according to claim 4, wherein the substrate is maintained at a temperature in the range of 50° to 75° C.

6. The method according to claim 4, further comprising the steps of:

etching the aluminum alloy film and the second layer; and annealing the substrate at a temperature of 400° C. or higher after the step of etching; wherein the aluminum alloy film includes copper.

7. The method according to claim 6, wherein the deposited aluminum-copper alloy film is etched using a reactive-ion-etching process.

8. A method for fabricating an integrated circuit device, the integrated circuit device including a substrate and a plurality of layers formed on an upper surface of the substrate, at least one of the plurality of layers comprising an aluminum alloy film, the method comprising the steps of:

mounting the substrate onto a platen;

depositing a first layer on the substrate;

depositing the aluminum alloy film on the first layer using a sputter deposition process; and depositing a second layer on the aluminum alloy film;

wherein a coolant fluid is circulated through the platen at a rate such that the substrate is maintained at a temperature lower than 100° C. during the step of depositing the aluminum alloy film.

9. The method according to claim 8, wherein the substrate is maintained at a temperature in the range of 50° to 75° C.

10. The method according to claim 8, further comprising the steps of:

etching the aluminum alloy film; and annealing the substrate at a temperature of 400° C. or higher after the step of etching; wherein the aluminum alloy includes copper.

11. The method according to claim 10, wherein the deposited aluminum alloy film is etched using a reactive-ion-etching process.

12. A method for forming an Al-Cu film on a base material, the method comprising the steps of:

continuously cooling the base material such that the base material has a temperature in the range of 50° C. and 75° C.; and depositing the Al-Cu film over the base material using a sputter deposition process while maintaining the base material at the said temperature.

* * * * *